United States Patent
Zhou et al.

(10) Patent No.: US 11,244,907 B2
(45) Date of Patent: Feb. 8, 2022

(54) METAL SURFACE PREPARATION FOR INCREASED ALIGNMENT CONTRAST

(71) Applicant: International Business Machines Corporation, Armonk, NY (US)

(72) Inventors: Tianji Zhou, Albany, NY (US); Saumya Sharma, Albany, NY (US); Dominik Metzler, Clifton Park, NY (US); Chih-Chao Yang, Glenmont, NY (US); Theodorus E. Standaert, Clifton Park, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 114 days.

(21) Appl. No.: 16/732,531

(22) Filed: Jan. 2, 2020

(65) Prior Publication Data

US 2021/0210434 A1     Jul. 8, 2021

(51) Int. Cl.
  *H01L 23/544* (2006.01)
  *G03F 9/00* (2006.01)

(52) U.S. Cl.
  CPC ............ *H01L 23/544* (2013.01); *G03F 9/708* (2013.01); *G03F 9/7076* (2013.01); *H01L 2223/54426* (2013.01); *H01L 2924/14* (2013.01)

(58) Field of Classification Search
  CPC ......... H01L 23/544; H01L 2223/54426; G03F 9/7076; G03F 9/708
  See application file for complete search history.

(56) References Cited

U.S. PATENT DOCUMENTS

| | | | |
|---|---|---|---|
| 4,468,855 A | 9/1984 | Sasaki | |
| 4,632,724 A | 12/1986 | Chesebro et al. | |
| 4,880,309 A | 11/1989 | Wanta | |
| 5,811,316 A | 9/1998 | Sugiura et al. | |
| 5,966,613 A * | 10/1999 | Zhao | H01L 21/314 438/401 |
| 6,136,662 A * | 10/2000 | Allman | G03F 9/708 257/E23.179 |
| 6,153,492 A | 11/2000 | Wege et al. | |
| 6,288,773 B2 | 9/2001 | Johnson et al. | |
| 6,352,904 B2 * | 3/2002 | Tan | G03F 9/7076 257/797 |
| 6,611,453 B2 | 8/2003 | Ning | |

(Continued)

OTHER PUBLICATIONS

Samudrala et al., "Alignment solutions on FBEOL layers using ASML scanners," Proc. of SPIE, vol. 10147, 101471T, 2017, 8 pages.

*Primary Examiner* — Bilkis Jahan
*Assistant Examiner* — Victor V Barzykin
(74) *Attorney, Agent, or Firm* — Cantor Colburn LLP; L. Jeffrey Kelly (57) ABSTRACT

Methods and structures for improving alignment contrast for patterning a metal layer generally includes depositing a metal layer having a plurality of grains, wherein grain boundaries between the grains forms grooves at a surface of the metal layer. The metal layer is subjected to surface treatment to form an oxide or a nitride layer and fill the surface grooves. The metal layer can be patterned using alignment marks in the metal layer and/or underlying layers. Filling the grooves with the oxide or nitride increases alignment contrast relative to patterning the metal layer without the surface treating.

19 Claims, 4 Drawing Sheets

(56) References Cited

U.S. PATENT DOCUMENTS

| | | | |
|---|---|---|---|
| 6,682,605 B2 | 1/2004 | Cheng et al. | |
| 7,723,203 B2 | 5/2010 | Kim | |
| 7,795,105 B2 * | 9/2010 | Goller | G03F 9/7084 |
| | | | 438/401 |
| 9,793,156 B1 * | 10/2017 | Yang | H01L 23/5226 |
| 2002/0076896 A1 * | 6/2002 | Farrar | G03F 9/7076 |
| | | | 438/401 |
| 2007/0254474 A1 * | 11/2007 | Shinomiya | H01L 21/76838 |
| | | | 438/637 |
| 2016/0268211 A1 * | 9/2016 | Hagio | H01L 21/32 |
| 2017/0323907 A1 * | 11/2017 | Kitagawa | G02F 1/1343 |
| 2020/0073228 A1 * | 3/2020 | Tanaka | G03F 1/80 |
| 2020/0176390 A1 * | 6/2020 | Chen | H01L 23/5226 |
| 2020/0243374 A1 * | 7/2020 | Choi | H01L 21/3212 |

\* cited by examiner

METAL SURFACE PREPARATION FOR INCREASED ALIGNMENT CONTRAST

BACKGROUND

The present invention generally relates to the manufacture of semiconductor integrated circuits, and more particularly, surface treatment of a metal layer including alignment marks to increase alignment contrast associated with the alignment marks.

Semiconductor integrated circuit (IC) fabrication involves forming multiple material layers with designed patterns on a semiconductor wafer. Each layer has to be aligned with previous layers such that the formed circuit can function properly. Various marks are used for this purpose. For example, alignment marks are used for alignment between a mask (a photo mask) and a semiconductor wafer. In another example, overlay marks are used to monitor overlay deviation between multiple layers on a wafer. In order to provide proper alignment of mask layers, photolithography tools are equipped to locate certain alignment marks on preceding layers, which can be optically detected by techniques well known in the art, such as bright field or dark field alignment. As semiconductor technology continues progressing to circuits having smaller feature sizes, alignment requirements become more stringent.

SUMMARY

Embodiments of the present invention are generally directed to methods of manufacturing semiconductor structures including alignment marks. A non-limiting example of a method of manufacturing a semiconductor structure according to one or more aspects of the present invention includes providing a substrate having one or more layers including an uppermost layer thereon. A metal layer is deposited on the uppermost layer. The metal includes grooves formed on a surface of the metal layer. At least one of the one or more layers and metal layer includes alignment marks. The surface of the metal layer is oxidized or nitrided to fill the grooves with an oxide, or a nitride, respectively. The metal layer is patterned using the alignment marks in the metal layer and/or the at least one or more layers.

A non-limiting example of the method of improving alignment contrast according to one or more aspects of the present invention includes depositing a metal layer that includes a plurality of grains, wherein grain boundaries between the plurality of grains forms grooves at a surface of the metal layer. The metal layer surface is treated to fill the grooves at the surface with an oxide or a nitride. The metal layer is patterned using a lithography process, wherein the pattern is aligned to an alignment mark underlying the metal layer. Filling the grooves with the oxide or the nitride increases alignment contrast relative to patterning the metal layer without the surface treating.

A non-limiting example of a semiconductor structure according to one or more aspects of the present invention includes a metal layer including a plurality of surface grooves. An oxide or nitride layer having a thickness of about 5 angstroms to about 10 nanometers is on the metal layer and fills the surface grooves. The semiconductor structure includes one or more underlying layers, wherein at least one of the underlying layers and/or the metal layer includes one or more alignment marks.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter that is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION

The present invention generally relates to methods for forming a semiconductor structure including a metallization layer with alignment marks therein. The methods generally include improving the alignment contrast associated with the alignment marks using a surface treatment step on the metallization layer.

Alignment marks are typically trench features of a certain pattern that are lithographically patterned on a surface of an underlying dielectric layer. A relatively thin conformal metal layer such as tungsten is then deposited into the trench features, which follows the contour of the trench features to form the alignment mark. A metallization layer is then formed on the dielectric layer. The metallization layer can include aluminum, copper, ruthenium, cobalt, rhodium, iridium, nickel, or alloys thereof or the like as desired for the application.

Figure 1:
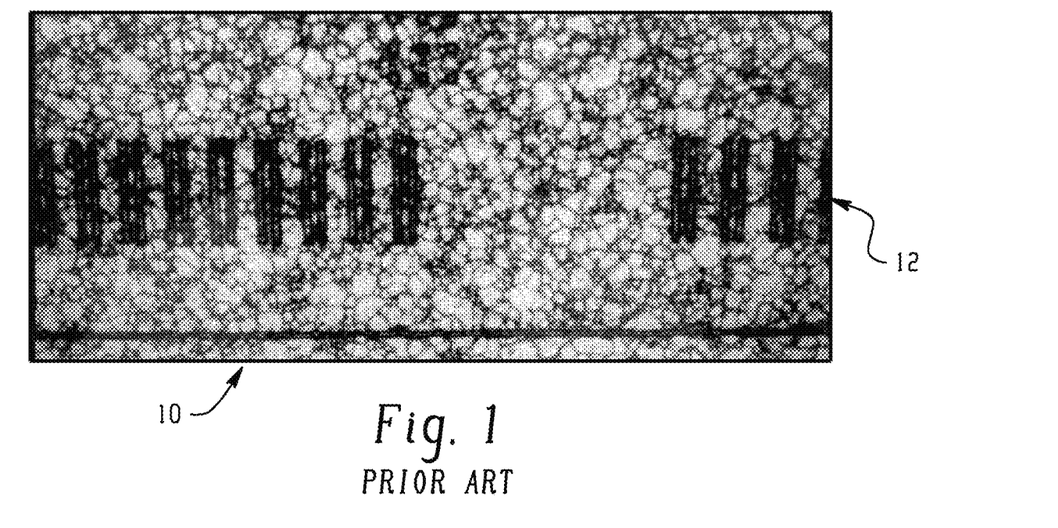
FIG. 1 pictorially depicts a micrograph of a prior art deposited metal layer including alignment marks therein.

One of the problems associated with lithographic alignment on relatively thick metal surfaces overlying an alignment mark is alignment contrast. Surface grain boundaries formed during deposition of the metal can introduce surface grooves, which interfere with the alignment signal from the alignment mark resulting in coarse and/or fine alignment rejections of the wafer being processed. However, subsequent patterning of the metallization layer such as by subtractive etching can be difficult because of the interference of the alignment signal due the presence of these surface grooves in the metallization layer. In the case of far back end of line (FBEOL) processes, for example, current aluminum level lithographic alignment is very challenging because of this issue, resulting in a wafer rejection rate greater than 30%. Prior Art FIG. 1 is a micrograph depicting a top down view of an aluminum metallization layer 10 overlying the alignment marks 12 that visually shows the interference on the identification of the alignment marks caused by the presence of grain boundaries that form surface grooves during deposition of the metal.

As will be described in greater detail herein, it has been discovered that reworking the metal layer subsequent to deposition of the metal layer can minimize interference of the alignment signal caused by the presence of the surface grooves. As used herein, the term reworking is intended to refer to a surface treatment step applied to the metal layer so as to improve the alignment signal. In the above example as it relates to FBEOL processing, the rejection rate because of alignment failure was reduced by 100 percent, i.e., all wafers passed through alignment. Surface treatment of the metal layer can include oxidizing or nitridizing the metal surface, and in one or embodiments of the invention, fill the surface grooves with an oxide or a nitride, which markedly improves alignment contrast.

Detailed examples of integrated circuits configured and arranged to include the semiconductor structure and methods of manufacturing the metallization structure according to aspects of the present invention will now be described herein. However, it is to be understood that the embodiments of the invention described herein are merely illustrative of the structures that can be embodied in various forms. In addition, each of the examples given in connection with the various embodiments of the invention is intended to be illustrative, and not restrictive. Further, the figures are not necessarily to scale, some features can be exaggerated to show details of particular components. Therefore, specific structural and functional details described herein are not to be interpreted as limiting, but merely as a representative basis for teaching one skilled in the art to variously employ the methods and structures of the present description. For the purposes of the description hereinafter, the terms "upper", "lower", "top", "bottom", "left," and "right," and derivatives thereof shall relate to the described structures, as they are oriented in the drawing figures. The same numbers in the various figures can refer to the same structural component or part thereof.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

Conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

It is to be understood that the various layers and/or regions shown in the accompanying drawings are not drawn to scale, and that one or more layers and/or regions of a type commonly used in complementary metal-oxide semiconductor (CMOS) fabrication techniques, fin field-effect transistor (FinFET) devices, metal-oxide-semiconductor field-effect transistor (MOSFET) devices, and/or other semiconductor fabrication techniques and devices, may or may not be explicitly shown in a given drawing. This does not imply that the layers and/or regions not explicitly shown are omitted from the actual devices. In addition, certain elements could be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present invention can be employed in applications, hardware, and/or electronic systems. Suitable hardware and systems for implementing embodiments of the invention can include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that could require, for example, CMOSs, MOSFETs, and/or FinFETs. By way of non-limiting example, the semiconductor devices can include, but are not limited to CMOS, MOSFET, and FinFET devices, and/or semiconductor devices that use CMOS, MOSFET, and/or FinFET technology.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It will also be understood that when an element, such as a layer, region, or substrate is referred to as being "on" or "over" another element, it can be directly on the other element or intervening elements can also be present. In contrast, when an element is referred to as being "directly on" or "directly over" another element, there are no intervening elements present, and the element is in contact with another element.

As used herein, the term "substrate" can include a semiconductor wafer, such as a type IV semiconductor wafer, e.g., silicon wafer, or a type III-V semiconductor wafer, such as a compound semiconductor, e.g., gallium arsenide semiconductor wafer. In one or more embodiments, a number of dielectric layers and semiconductor material layers can be arranged with the substrate to provide microelectronic devices, or smaller devices, which can include semiconductor devices, such as field effect transistors (FETs), fin type field effect transistors (FinFETs), bipolar junction transistors (BJT) and combinations thereof. The at least one device layer can also include memory devices, such as dynamic random access memory (DRAM), embedded dynamic random access memory (EDRAM), flash memory and combinations thereof. The at least one device layer can also include passive devices, such as resistors and capacitors, as well as electrical connections to the devices containing within the at least one device layer.

It should also be noted that not all masking, patterning, and lithography processes are shown, because a person of ordinary skill in the art would recognize where masking and patterning are utilized to form the identified layers and openings, and to perform the identified selective etching processes, as described herein.

The alignment marks are not intended to be limited to any particular shape or form. At present, two kinds of alignment modes are mainly being used in a photolithography process, namely, zero-mark alignment and scribe lane mark alignment. In zero-mark alignment, generally only a first layer of pattern has an alignment mark such as XPA (extended primary mark) disposed therein all other subsequent layers are aligned with the first layer. The zero mark is commonly formed on a margin region of the pattern. In scribe lane mark alignment, an alignment mark, such as bar type SPM (scribe lane primary mask), is formed in the scribe lanes of each layer or several layers. A pattern layer can be aligned with the alignment mark from one of previous layers. Exemplary alignment marks include vernier marks, cross structures, and the like. Typically, two alignment marks, one on each side of the wafer, are used to align the mask and the wafer. One alignment mark is sufficient to align the mask and wafer in the x and y directions, but two marks are required to correct for fine offset in rotation.

Figure 2:
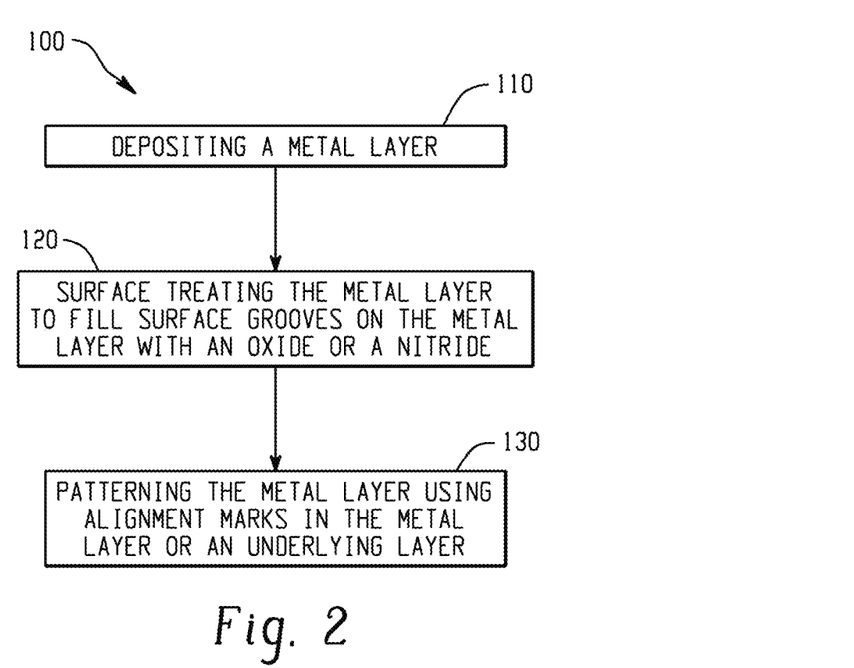
FIG. 2 schematically illustrates a process flow for forming a semiconductor structure in accordance with one or more embodiments of the present invention.

Referring now to FIG. 2, there is shown a process flow 100 in accordance with one or more embodiments of the present invention. In block 110, a metal layer is deposited. Typically, in the manufacture of semiconductor devices the thickness of the deposited metal layer can range from about 100 nanometers (nm) to about 5000 nm. The metal layer can be deposited onto, for example, a dielectric layer, which as noted above, can include an alignment mark formed on a surface thereof, e.g., a trench feature. Alternatively, or in addition to the alignment mark on the surface of the dielectric layer, one or more of the underlying layers can include an alignment mark.

The metal layer can be formed by CVD, sputtering, electrochemical deposition or like processes. For example, the deposition of copper can proceed by electrochemical deposition such as electroplating or electroless plating. The resulting deposited metal layer include grain boundaries that result in groove formation at the surface. The metal used to form the metal layer is not intended to be limited and can include copper, aluminum, ruthenium, cobalt, alloys thereof, and the like with the proviso that the deposited metal results in surface grain boundaries that affect alignment mark detection.

In Block 120, surface treatment of the metal layer is performed, which can result in formation of an oxide layer or a nitride layer that fills the voids of the surface grooves. As will be described in greater detail below, suitable surface treatment process to form the oxide or nitride in accordance with one or more embodiments include wet processing, oxygen plasma ashing, plasma processing, exposure to air, and in situ oxygen, nitrogen, or ammonia treatment. Filling the surface grooves with the oxide or the nitride has been found to improve alignment contrast.

In Block 130, the metal layer subsequent to surface treatment is patterned using lithography with the pattern aligned to the alignment mark on the underlying dielectric layer and/or any one of the underlying layers.

As noted above, surface treatment can include wet processing the substrate to form an oxide layer and/or decrease roughness caused by the surface grain boundaries of the deposited metal. An exemplary wet process includes contact the metal layer with a solution containing dilute hydrofluoric acid (HF), dilute sulfuric peroxide (DSP) or the like. Typical dilution ratios for application of the dilute HF solution range from 1:1 ($H_2O$:HF) to 100:1 ($H_2O$:HF). DSP is a dilute solution of sulfuric acid and hydrogen peroxide in water, which can also include small amounts of HF. Typical dilution ratios for application of the dilute DSP solution range from 1:1 $H_2O$:sulfuric peroxide to 100:1 $H_2O$:sulfuric peroxide. Optionally, a surfactant can be included in the solutions.

The plasma process generally utilizes a plasma source to generate a plasma from a gas mixture containing oxygen gas or oxygen containing gas, nitrogen or a nitrogen containing gas such as forming gas as one of its components so as to generate monoatomic oxygen. By way of example, monoatomic oxygen can be generated from an oxygen plasma, which can oxidize with the metal surface to form an oxide layer and fill the voids of the surface grooves caused by the grain boundaries at the surface during the metal deposition process. The plasma chemistries for forming a nitride or oxygen layer s are well known in the art and are not intended to be limited. Optimization of the plasma process to form the desired amount of oxidation nitridization of the metal layer is well within the skill of those in the art.

Air exposure generally introduces air into the processing chamber for a period effective to oxidize the surface of the metal layer. Similarly, oxygen gas can be introduced into the processing chamber for a period of time to provide the desired amount of oxidation to the metal layer. Likewise, nitrogen or ammonia gas can be introduced into the processing chamber for a period of time to provide the desired amount of nitriding to the metal layer.

Figure 3:
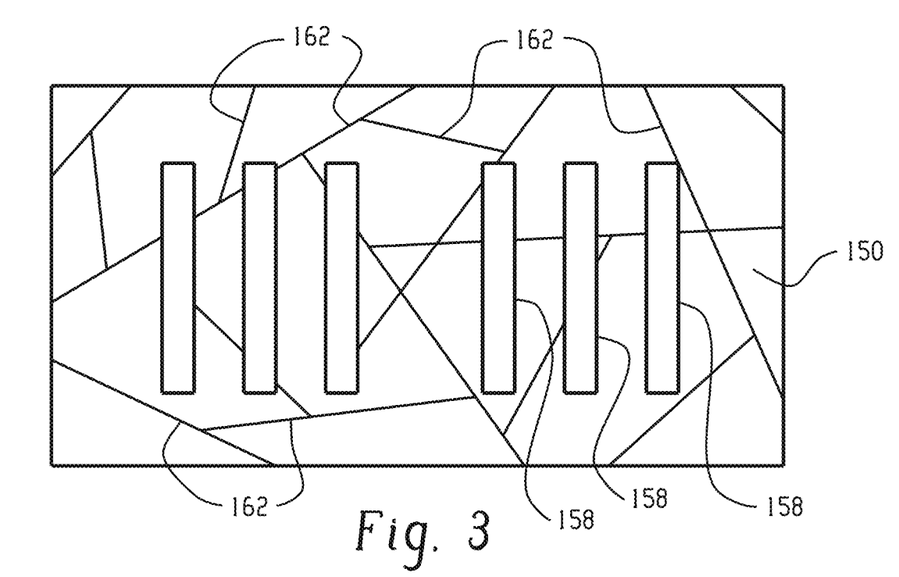
FIG. 3 illustrates a top down view of a metal layer including alignment marks.
Figure 4:
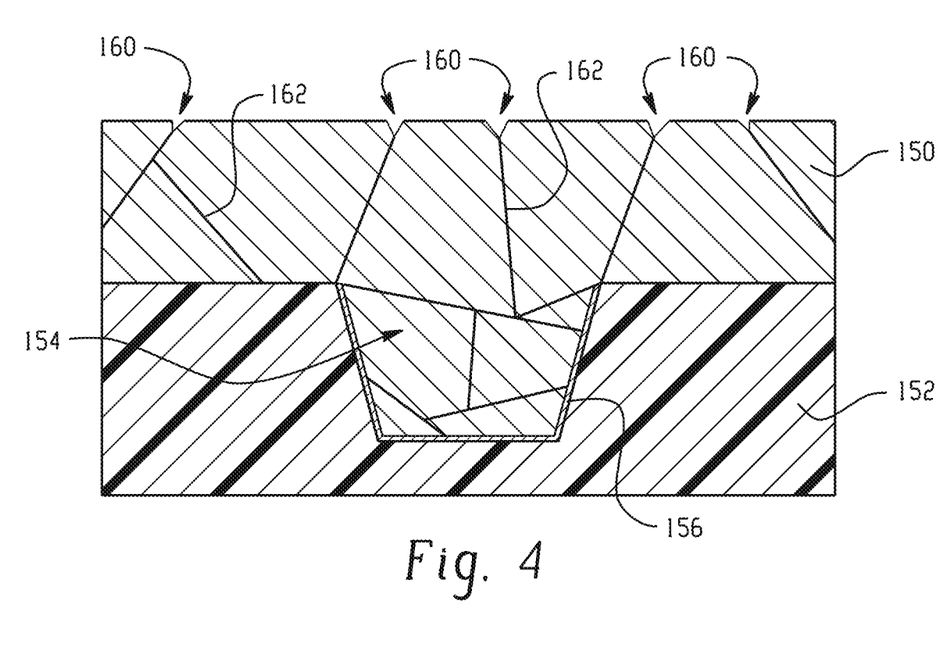
FIG. 4 illustrates a cross sectional view of a metal layer including an alignment mark.

In FIGS. 3 and 4, there is shown a top down and cross-sectional view of a metal layer 150 formed on an underlying layer 152. The underlying layer 152 can include a dielectric layer, for example, that is patterned to include trench features 154. The patterned trench feature can further include a conformal metal layer 156 such as tungsten to function as an alignment mark 158 (see FIG. 3). The conformal metal layer can be deposited by PVD, CVD, or ALD processes. The trench features 154, when utilized for forming the alignment markers, typically has sloped sidewalls as shown.

Deposition of the metal layer onto the underlying layer 152. As noted above, the metal layer can be formed by CVD, sputtering, electrochemical deposition or like processes. The particular process for depositing the metal as well as subsequent processing can affect grain size. Grain size generally refers to the size of the individual crystallites or particles that compose a solid metal. Grain size, as well as the boundaries 162 between the grains, are important factors for determining physical properties of the entire metal. In thin film deposition, if the particles are deposited with high energy, and there is a high amount of migration present in the particles, then the grain size will be smaller. If there is lower migration when the particles condense on the substrate, then the grain size will be higher. Likewise, if the metal layer is later subjected to an annealing process, the grain size can further increase. Regardless of the deposition process, the resulting grain boundaries between grains can cause surface grooves as shown more clearly in FIG. 4. The presence of these surface grooves can decrease the alignment contrast.

The dielectric 152 can be any dielectric material including inorganic dielectrics or organic dielectrics. The dielectric material can be porous or non-porous. Some examples of suitable dielectrics that can be used as the dielectric material include, but are not limited to: $SiO_2$, silsesquioxanes, carbon doped oxides (i.e., organosilicates) that include atoms of Si, C, O and H, thermosetting polyarylene ethers, or multilayers thereof. The term "polyarylene" is used to denote aryl moieties or inertly substituted aryl moieties which are linked together by bonds, fused rings, or inert linking groups such as, for example, oxygen, sulfur, sulfone, sulfoxide, carbonyl and the like. The dielectric layer 152 can be deposited by PECVD procedures as is generally known in the art. Oftentimes in the manufacture of semiconductor structures, the dielectric layer can be silicon dioxide.

Figure 5:
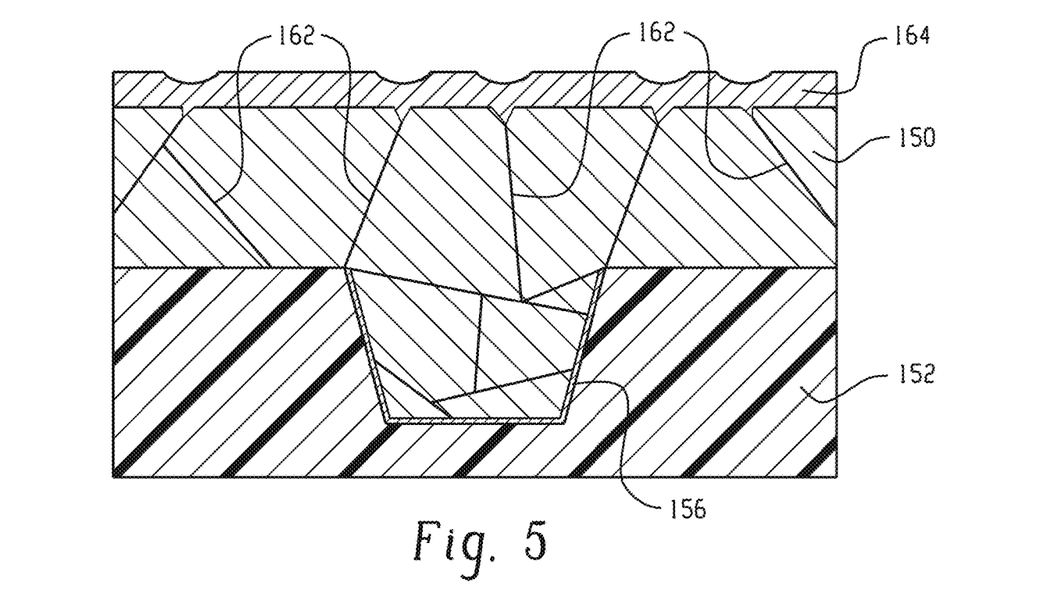
FIG. 5 illustrates a cross sectional view of the semiconductor structure of FIG. 4 subsequent to formation of an oxide layer or a nitride layer to fill surface grooves in the metal layer in accordance with one or more embodiments of the present invention.

Next, the metal layer is subjected to surface treatment, which can include oxidizing or nitriding the metal surface to form an oxide or nitride layer 164 that fills the surface grooves as shown in FIG. 5. As shown in the top down view of FIG. 6, filling the surface grooves with an oxide or nitride and forming the oxide or nitride layer 164 improves alignment contrast as compared to the top down view in FIG. 3. In one or more embodiments, the oxide or nitride layer 164 can be at a thickness of about 5 angstroms (Å) to about 10 nanometers (nm). Surface treatment can include exposing the metal layer to a dilute solution of HF or DSP; an oxygen plasma ashing process, air for a period of time to cause the desired amount of oxidation, in situ oxygen ($O_2$) treatment, and/or in situ nitrogen ($N_2$) or ammonia ($NH_3$) treatment.

Figure 6:
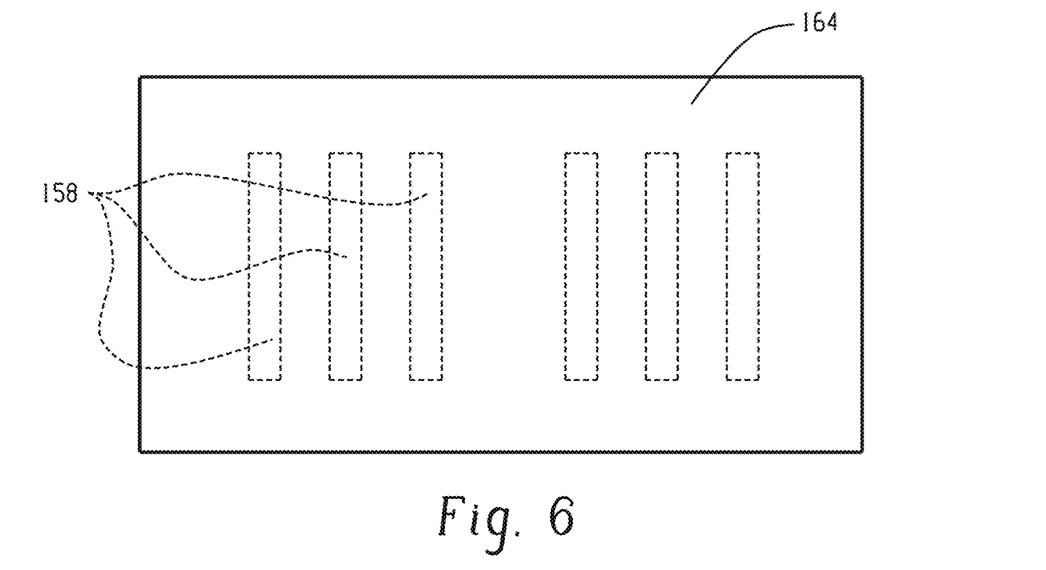
FIG. 6 illustrates a top down view of the semiconductor structure of FIG. 5 in accordance with one or more embodiments of the present invention.

Following oxidation or nitriding of the metal layer to fill the surface grooves resulting from the deposition of the metal and form an oxide or nitride layer 164, the metal layer can be patterned through conventional lithography and etching processes as shown in FIG. 6.

Figure 7:
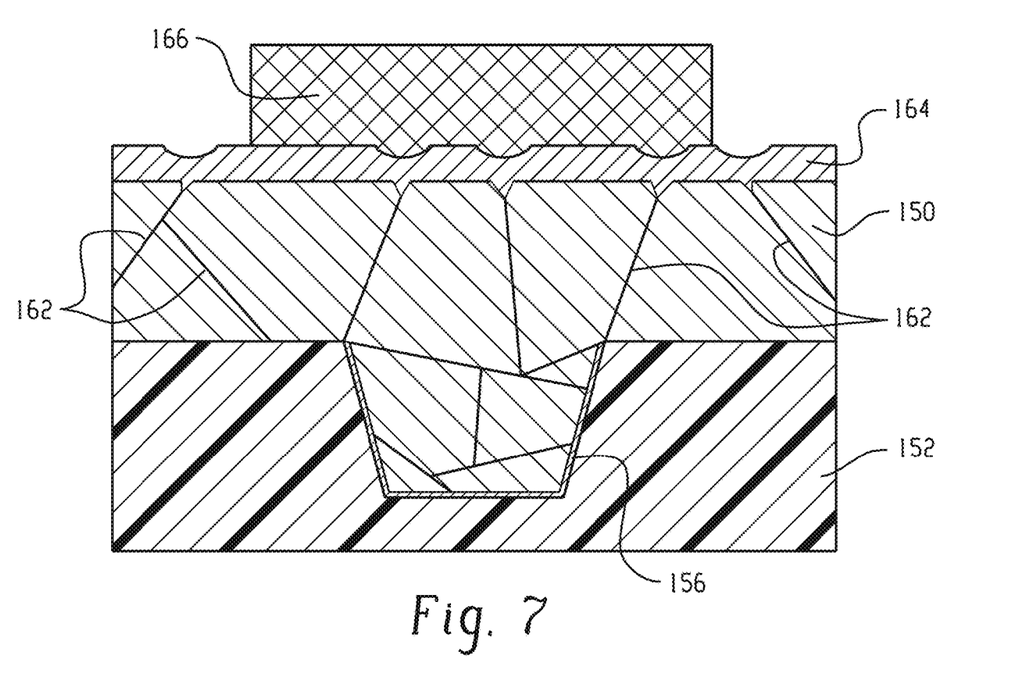
FIG. 7 illustrates a cross sectional view of the semiconductor structure of FIG. 5 subsequent to formation lithographic patterning of a photoresist layer on the oxide or the nitride layer in accordance with one or more embodiments of the present invention.
Figure 8:
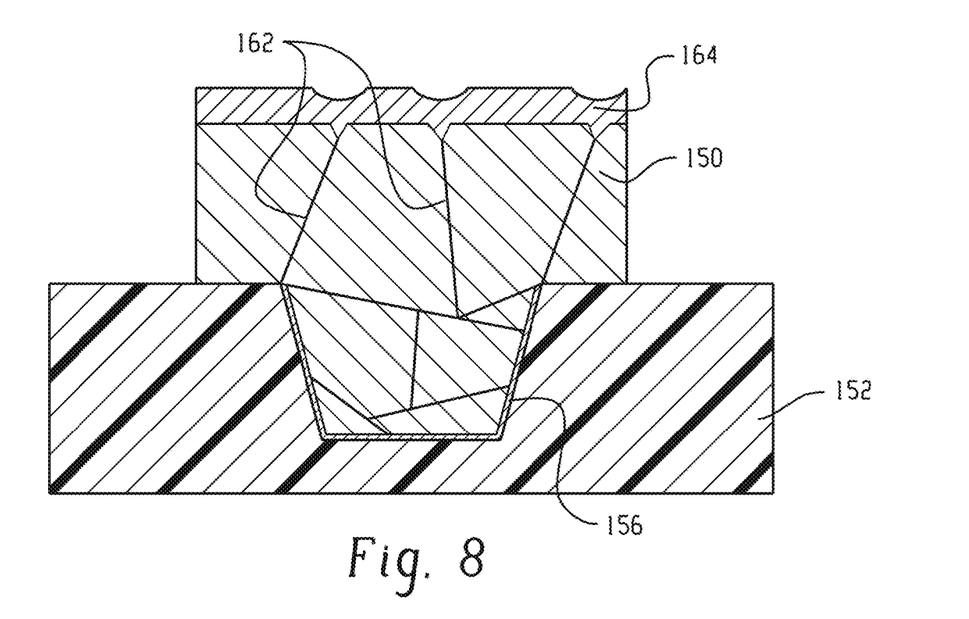
FIG. 8 illustrates a cross sectional view of the semiconductor structure of FIG. 7 subsequent to transferring the patterned photoresist layer to the metal layer in accordance with one or more embodiments of the present invention.

The lithographic step typically includes applying a photoresist 166 to the surface of the metal layer, exposing the photoresist to a desired pattern of radiation, and developing the exposed resist utilizing a conventional resist developer to form a pattern. The etching process can be a dry etching or wet etching process. The term "wet etching" generally refers to application of a chemical solution. This is preferably a time-controlled dip in the etch solution. Preferred etch solutions include $HNO_3$, HCL, $H_2SO_4$, HF or combinations thereof. The term "dry etching" is used here to denote an etching technique such as reactive-ion-etching (RIE), ion beam etching, plasma etching or laser ablation. During the etching process, the pattern is first transferred to the dielectric layer. The patterned photoresist is typically, but not necessarily, removed from the structure after the pattern has been transferred into the dielectric film. The patterned feature formed into the dielectric material includes the contact holes. FIG. 8 provides a cross sectional view of the patterned metal layer.

The descriptions of the various embodiments of the present invention have been presented for purposes of illustration, but are not intended to be exhaustive or limited to the embodiments of the invention described. Many modifications and variations will be apparent to those of ordinary skill in the art without departing from the scope and spirit of the described embodiments of the invention. The terminology used herein was chosen to best explain the principles of the embodiments of the invention, the practical application or technical improvement over technologies found in the marketplace, or to enable others of ordinary skill in the art to understand the embodiments of the invention described herein.

What is claimed is:

1. A method for forming an integrated circuit comprising:
   providing a substrate comprising one or more layers including an uppermost layer thereon;
   depositing a metal layer on the uppermost layer, wherein the metal layer comprises grooves formed on a surface of the metal layer, and wherein one or more layers and/or the metal layer comprises alignment marks;
   oxidizing the surface of the metal layer to fill the grooves with an oxide, or nitriding the surface of the metal layer to fill the grooves with a nitride; and
   patterning the metal layer using the alignment marks in the metal layer and/or the one or more layers.

2. The method of claim 1, wherein the metal layer comprises aluminum, copper, ruthenium, cobalt, rhodium, iridium, nickel, or alloys thereof.

3. The method of claim 1, wherein oxidizing the surface of the metal layer to fill the grooves with the oxide comprises exposing the surface to a solution comprising hydrofluoric acid and water or sulfuric acid, hydrogen peroxide, and water.

4. The method of claim 1, wherein oxidizing the surface of the metal layer to fill the grooves with the oxide comprises exposing the surface to an oxygen plasma ashing process.

5. The method of claim 1, wherein oxidizing the surface of the metal layer to fill the grooves with the oxide comprises exposing the surface to atmospheric air.

6. The method of claim 1, wherein oxidizing the surface of the metal layer to fill the grooves with the oxide comprises exposing the surface to oxygen ($O_2$) gas, or diluted oxygen $O_2$ with nitrogen $N_2$.

7. The method of claim 1, wherein nitriding the surface of the metal layers to fill the grooves with the nitride comprises exposing the surface to nitrogen ($N_2$) gas or ammonia ($NH_3$) gas.

8. The method of claim 1, wherein patterning the metal layer using the alignment marks comprises a lithography process.

9. The method of claim 1, wherein the oxide or nitride layer is at a thickness of 5 angstroms to 10 nanometers.

10. A method of improving alignment contrast comprising:
depositing a metal layer comprising a plurality of grains, wherein grain boundaries between the grains forms grooves at a surface of the metal layer;
surface treating the metal layer to fill the grooves at the surface with an oxide or a nitride; and
patterning the metal layer using a lithography process using an alignment mark underlying the metal layer, wherein filling the grooves with the oxide or the nitride increases alignment contrast relative to patterning the metal layer without the surface treating.

11. The method of claim 10, wherein surface treating the metal layer to fill the grooves with the oxide comprises exposing the surface to a solution comprising hydrofluoric acid and water or sulfuric acid, hydrogen peroxide, and water.

12. The method of claim 10, wherein surface treating the metal layer to fill the grooves with the oxide comprises exposing the surface to an oxygen plasma ashing process.

13. The method of claim 10, wherein surface treating the metal layer to fill the grooves with the oxide comprises exposing the surface to atmospheric air.

14. The method of claim 10, wherein surface treating the metal layer to fill the grooves with the oxide comprises exposing the surface to oxygen ($O_2$) gas, or diluted $O_2$ with $N_2$.

15. The method of claim 10, wherein surface treating the metal layer to fill the grooves with the nitride comprises exposing the surface to nitrogen ($N_2$) gas or ammonia ($NH_3$) gas.

16. The method of claim 10, wherein the metal comprises aluminum, copper, ruthenium, cobalt, rhodium, iridium, nickel, or alloys thereof.

17. The method of claim 10, wherein the oxide or the nitride layer is at a thickness of 5 angstroms to 10 nanometers.

18. The method of claim 10, wherein the alignment mark comprises a trench feature comprising a conformal tungsten layer.

19. A semiconductor structure comprising:
a metal layer comprising a plurality of surface grooves, wherein the surface grooves are defined by surface areas where grain boundaries in the metal layer are exposed to atmosphere;
an oxide layer or a nitride layer at a thickness of 5 angstroms to 10 nanometers on the metal layer filling the plurality of surface grooves; and
one or more underlying layers, wherein at least one of the underlying layers and/or the metal layer comprise one or more alignment marks.

* * * * *